United States Patent
Michalski

(10) Patent No.: US 6,859,159 B2
(45) Date of Patent: Feb. 22, 2005

(54) SWITCHED-CAPACITOR STRUCTURES WITH ENHANCED ISOLATION

(75) Inventor: Christopher Michalski, High Point, NC (US)

(73) Assignee: Analog Devices, Inc., Norwood, MA (US)

( * ) Notice: Subject to any disclaimer, the term of this patent is extended or adjusted under 35 U.S.C. 154(b) by 92 days.

(21) Appl. No.: 10/463,933

(22) Filed: Jun. 18, 2003

(65) Prior Publication Data

US 2004/0070917 A1 Apr. 15, 2004

(Under 37 CFR 1.47)

Related U.S. Application Data

(60) Provisional application No. 60/389,469, filed on Jun. 18, 2002.

(51) Int. Cl.[7] .............................................. H03M 1/12
(52) U.S. Cl. ....................... 341/172; 341/143; 341/161; 341/136
(58) Field of Search ................................ 341/172, 161, 341/143, 122, 136

(56) References Cited

U.S. PATENT DOCUMENTS

| | | | |
|---|---|---|---|
| 5,790,064 A | * | 8/1998 | Fujimori ..................... 341/172 |
| 5,838,175 A | | 11/1998 | Hsieh et al. .................. 327/94 |
| 6,028,459 A | | 2/2000 | Birdsall et al. ............... 327/94 |
| 6,040,793 A | * | 3/2000 | Ferguson, Jr. et al. ...... 341/172 |
| 6,304,205 B1 | | 10/2001 | Rezvani et al. ............. 341/161 |
| 6,351,506 B1 | * | 2/2002 | Lewicki ...................... 341/172 |
| 6,369,744 B1 | | 4/2002 | Chuang ...................... 341/161 |
| 6,384,758 B1 | | 5/2002 | Michalski ................... 341/122 |
| 6,509,790 B1 | * | 1/2003 | Yang .......................... 341/172 |
| 6,614,285 B2 | * | 9/2003 | Lee et al. .................... 341/172 |
| 6,768,443 B2 | * | 7/2004 | Willis ......................... 341/172 |

* cited by examiner

Primary Examiner—Michael Tokar
Assistant Examiner—Lam T. Mai
(74) Attorney, Agent, or Firm—Koppel, Jacobs, Patrick & Heybl

(57) ABSTRACT

Switched-capacitor structures are provided that reduce distortion and noise in their processed signals because they increase isolation between structural elements and ensure that selected elements are securely turned off in one mode and quickly turned on in another mode.

8 Claims, 3 Drawing Sheets

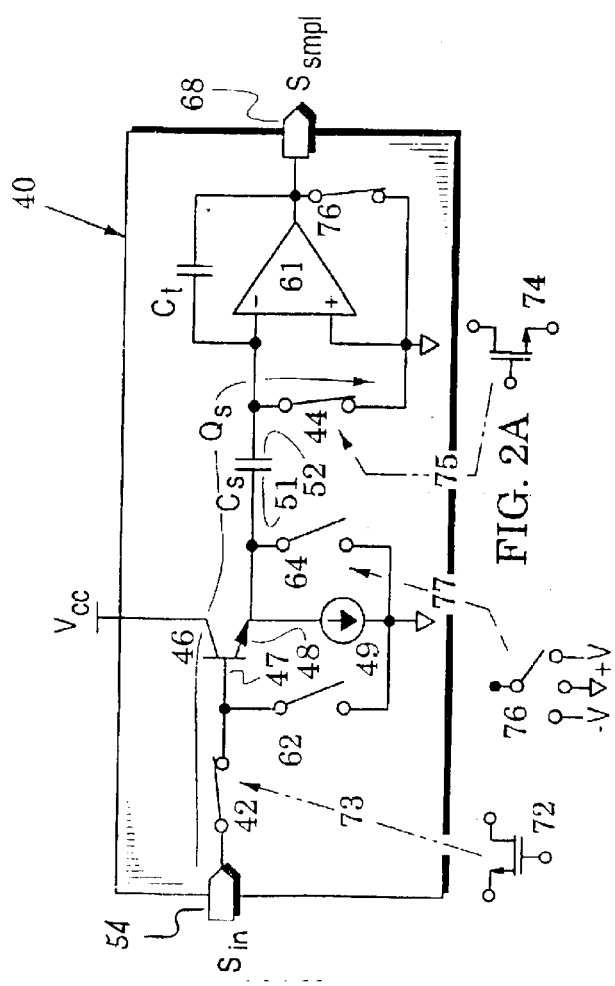
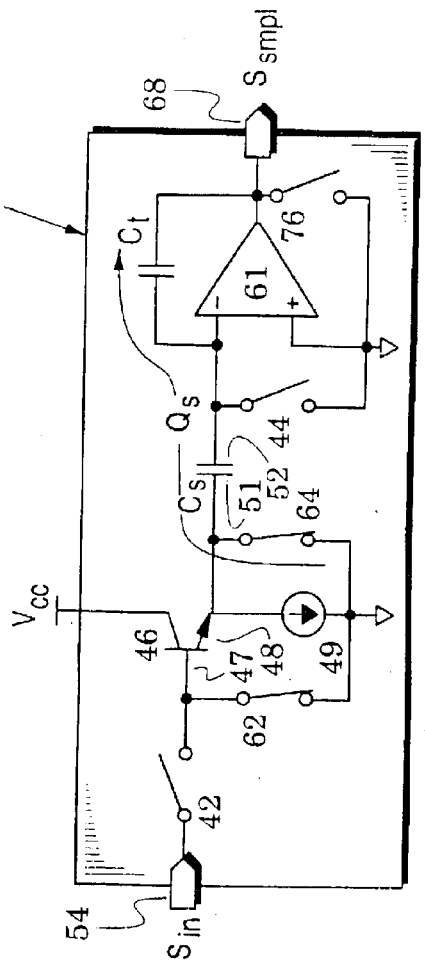

US 6,859,159 B2

SWITCHED-CAPACITOR STRUCTURES WITH ENHANCED ISOLATION

CROSS REFERENCES TO RELATED APPLICATIONS

This application claims the benefit of U.S. Provisional Application Ser. No. 60/389,469 filed Jun. 18, 2002.

BACKGROUND OF THE INVENTION

1. Field of the Invention

The present invention relates generally to switched-capacitor structures.

2. Description of the Related Art

FIGS. 1A and 1B illustrate a conventional switched-capacitor structure 10 in which a sample capacitor $C_s$ has a top plate 11 coupled to the inverting input of a differential amplifier 12 and a bottom plate 13 coupled through a first sample switch 14 to an input port 15. The differential amplifier 12 drives an output port 16 and a transfer capacitor $C_t$ is coupled across the differential amplifier. The differential amplifier has a high gain so that its non-inverting input has substantially the same potential as its inverting input. Finally, a second sample switch 17 and a transfer switch 18 are respectively coupled to the top and bottom plates 11 and 13. The first and second sample switches 14 and 17 and the transfer switch 18 are generally realized with transistors.

FIG. 1A illustrates a sample operation of the switched-capacitor structure 10 in which the first and second sample switches 14 and 17 are closed so that an analog input signal $S_{in}$ at the input port 15 urges an electrical sample charge $Q_s$ into the sample capacitor $C_s$ to thereby generate a sample signal $S_s=Q_s/C_s$ across the sample capacitor.

FIG. 1B illustrates a transfer operation of the switched-capacitor structure 10 in which the first and second sample switches 14 and 17 are opened and the bottom plate 13 is grounded through the closed transfer switch 18. Because the signal across the sample capacitor $C_s$ is now substantially zero, the sample charge $Q_s$ is transferred into the transfer capacitor $C_t$ to generate an output processed signal $S_{prcsd}=Q_s/C_t$ at the output port 16. The sample and transfer operations of FIGS. 1A and 1B thereby generate a $S_{prcsd}/S_{in}$ transfer function of $C_s/C_t$. Accordingly, this transfer function is represented in the graph 20 of FIG. 1C by a plot 22 which has a slope of $C_s/C_t$.

The switched-capacitor structure 20 of FIGS. 1A and 1B is thus especially suited for use as a sampler 32 in the pipelined analog-to-digital converter (ADC) 30 of FIG. 1D. The sampler 32 processes an analog input signal $S_{in}$ at an input port 33 into a sampled signal $S_{smpl}$ at a system node 34. In response, an initial ADC stage 35 (e.g., a flash ADC) converts this sampled signal $S_{smpl}$ into at least one most-significant bit $D_o$ of a digital output signal that corresponds to the input signal $S_{in}$. At the same time, the sampled signal is processed into a residue signal $S_{res}$ that is suitable for subsequent processing by downstream ADC stages into the less-significant bits of the output digital signal.

If the initial ADC stage is a 1.5 bit converter stage, for example, it provides decision signals 36 that are equally spaced from the midpoint of the range of the input signal $S_{in}$. In response, the residue signal $S_{res}$ is preferably represented by a plot 24 in FIG. 1C that has three segments defined by the decision signals and has a slope in each segment that is twice the slope of the plot 22.

The plot 24 can be generated, for example, by supplementing the sample capacitor $C_s$ of FIGS. 1A and 1B with an additional sample capacitor to realize the increased slope (i.e., increased gain) and by designing the transfer switch 18 so that it responds to the decision signals (36 in FIG. 1D) by applying selected offset signals to the bottom plates of the sample capacitors. When the switched-capacitor structure 20 of FIGS. 1A and 1B is modified in this fashion, it is typically referred to as a multiplying digital-to-analog converter (MDAC) which is indicated in FIG. 1D as an MDAC 38.

Although switched-capacitor structures are especially suited for accurate realization with integrated-circuit photolithographic techniques, their isolation from input circuits has generally been less than desired.

BRIEF SUMMARY OF THE INVENTION

The present invention is directed to switched-capacitor structures that increase upstream and downstream isolation between structural elements.

The novel features of the invention are set forth with particularity in the appended claims. The invention will be best understood from the following description when read in conjunction with the accompanying drawings.

BRIEF DESCRIPTION OF THE DRAWINGS

FIGS. 2A and 2B are schematic diagrams that respectively show a switched-capacitor embodiment of the present invention in a sample mode and a transfer mode.

DETAILED DESCRIPTION OF THE INVENTION

Figure 1D:
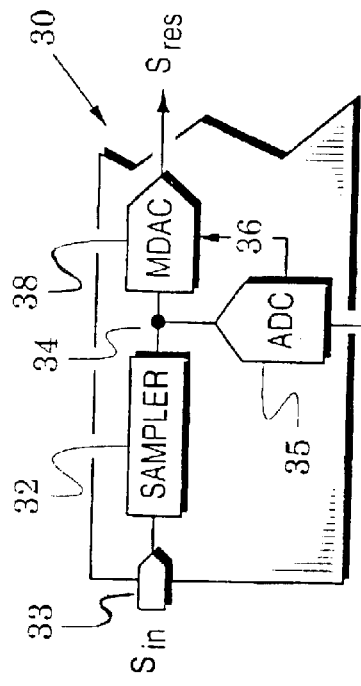
FIG. 1D illustrates a pipelined ADC that includes the switched-capacitor structure of FIGS. 1A and 1B.
Figure 1B:
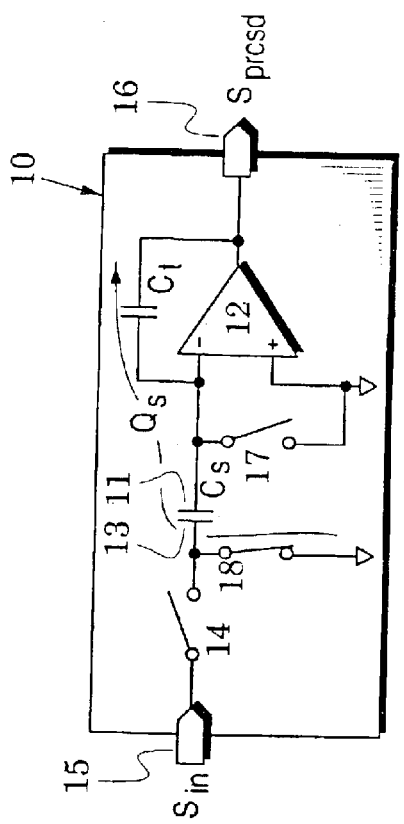
FIGS. 1A and 1B are schematic diagrams that respectively show a conventional switched-capacitor structure in a sample mode and a transfer mode.

FIGS. 2A and 2B illustrate a switched-capacitor embodiment 40 which is suitable for sampling an analog input signal $S_{in}$ in a sample mode of operation and providing a sample signal $S_{smpl}$ at an output port during a transfer mode of operation. When used as a sampler (e.g., as shown in FIG. 1D), the embodiment 40 effectively enhances and ensures upstream isolation.

In particular, the sampler 40 includes first and second sample switches 42 and 44 and a buffer transistor 46 which has a control terminal 47 coupled to the first sample switch 42 and has a current terminal 48 that is responsive to the control terminal 47. The current terminal is coupled to a current source 49 and another current terminal is coupled to a bias voltage (e.g., $V_{cc}$). A sample capacitor $C_s$ has a bottom plate 51 coupled to the current terminal 48 and a top plate 52 coupled to the second sample switch 44. The first sample switch 42 is coupled to a sampler input port 54 to receive an analog input signal $S_{in}$.

In addition, the inverting input of a differential amplifier 61 is coupled to the top plate 52, a transfer capacitor $C_t$ is coupled about the differential amplifier, and first and second transfer switches 62 and 64 are respectively coupled to the control terminal 47 and the current terminal 48. The output of the differential amplifier 61 provides a sample signal $S_{smpl}$ at a sampler output port 68. Although not specifically shown, an initial stage of the differential amplifier is preferably formed with a differential pair of transistors.

FIG. 2A illustrates the sample mode of operation in which the first and second sample switches 42 and 44 are closed so that the analog input signal $S_{in}$ urges an electrical sample charge $Q_s$ through the buffer transistor 46 to thereby generate a sample signal $S_s = Q_s/C_s$ across the sample capacitor. During the sample mode, the first and second transfer switches 62 and 64 are set in their open states.

FIG. 2B illustrates the transfer mode of operation in which the first and second transfer switches 62 and 64 are closed to respectively bias off the buffer transistor 46 and transfer the sample charge $Q_s$ to the transfer capacitor $C_t$ to generate an output processed signal $S_{prcsd} = Q_s/C_t$ at the output port 16. During the transfer mode, the first and second sample switches 42 and 44 are set in their open states.

The sampler 40 also preferably includes a discharge switch 76 which is coupled to the output of the differential amplifier 61. The discharge switch 76 is closed at the end of the transfer mode to clear charges from the transfer capacitor $C_t$ and prepare it for reception of a new charge in the succeeding transfer mode. Accordingly, the discharge switch 76 is closed in FIG. 2B and open in FIG. 2A.

In FIGS. 2A and 2B, the buffer transistor 46 is shown as a bipolar junction transistor so that the control and current terminals 46 and 48 are respectively a base and an emitter and the buffer stage is an emitter follower stage. The teachings of the invention may be practiced, however with other buffer transistors (e.g., a metal-oxide semiconductor (MOS) transistor).

In order to enhance understanding of the operational processes of the sampler 40, the sample and transfer switches of FIGS. 2A and 2B are indicated with conventional switch symbols. In practice, however, the sample and transfer switches of FIGS. 2A and 2B are preferably realized with MOS transistors as exemplified by first and second n-type MOS sample transistors 72 and 74 of FIG. 2A which replace the first and second sample switches 42 and 44 as respectively indicated by replacement arrows 73 and 75.

It has been found that the operation of conventional samplers is often degraded by spurious charges that are injected into the "on resistance" of a transistor that lies in the sample signal path (i.e., the path defined by the sample charge $Q_s$ in FIG. 2A). It has been determined, for example, that gate movement in the second sample transistor 74 (e.g., when the gate potential is varied to turn the transistor off in order to exit the sample mode) injects an electrical charge upstream to where it passes through the "on resistance" of the first sample transistor 72 and thereby generates a varying signal that distorts the sample charge $Q_s$.

In contrast to conventional structures and in accordance with a feature of the present invention, however, the sampler 40 inserts the buffer transistor 46 into the signal path to separate the first and second sample transistors 72 and 74. The low downstream-to-upstream gain of this emitter follower significantly reduces the injected charge that reaches the first sample transistor 72 and thus significantly reduces the associated distortion. The buffer transistor 46 provides a low-noise, low-distortion signal path for the sample charge $Q_s$ and a fast switching process for transitioning to the transfer mode.

Accuracy of the sampling process requires that a high upstream isolation is realized during the transfer of the sample charge $Q_s$ into the transfer capacitor $C_t$ (as shown in FIG. 2B). In another feature of the present invention, this upstream isolation is enhanced by the series combination of the buffer transistor 46 and the first sample switch 42.

This enhancement is only realized, however, if the buffer transistor 46 is fully turned off during the transfer mode. In accordance with another feature of the present invention, the first transfer switch 62 pulls down the control terminal 47 and thereby ensures that the buffer transistor 46 is securely turned off. Because the control terminal is held at a low potential, the buffer transistor will remain off even as different potentials are presented through the second transfer switch 64 to the current terminal 48.

Figure 1C:
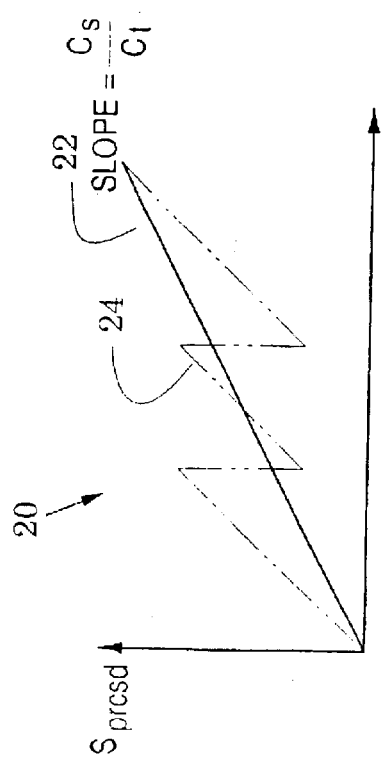
FIG. 1C is a graph that illustrates responses of the switched-capacitor structure of FIGS. 1A and 1B.
Figure 1A:
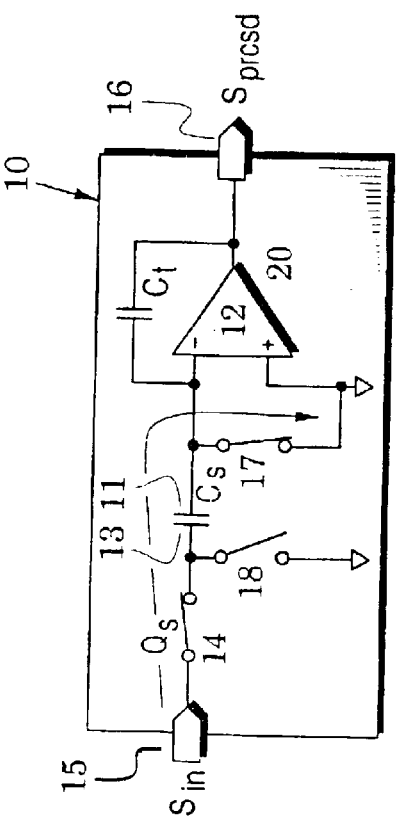

For example, the switched-capacitor structure 40 is especially suited for use as an MDAC in pipelined ADCs (e.g., as shown in FIG. 1D). In an MDAC structure, the second transfer switch 64 may be replaced by a multipole transfer switch 78 as indicated by the replacement arrow 79 in FIG. 2A. This switch can selectively couple different offset signals (e.g., $-V$ and $+V$) to the bottom plate 51 of the sample capacitor $C_s$ to thereby generate appropriate residue signals $S_{res}$ (e.g., as represented by the plot 24 in FIG. 1C). In this MDAC arrangement, the first transfer switch 62 can couple the control terminal 47 to a potential that is sufficiently low to ensure that the buffer transistor 46 is securely turned off.

Figure 3:
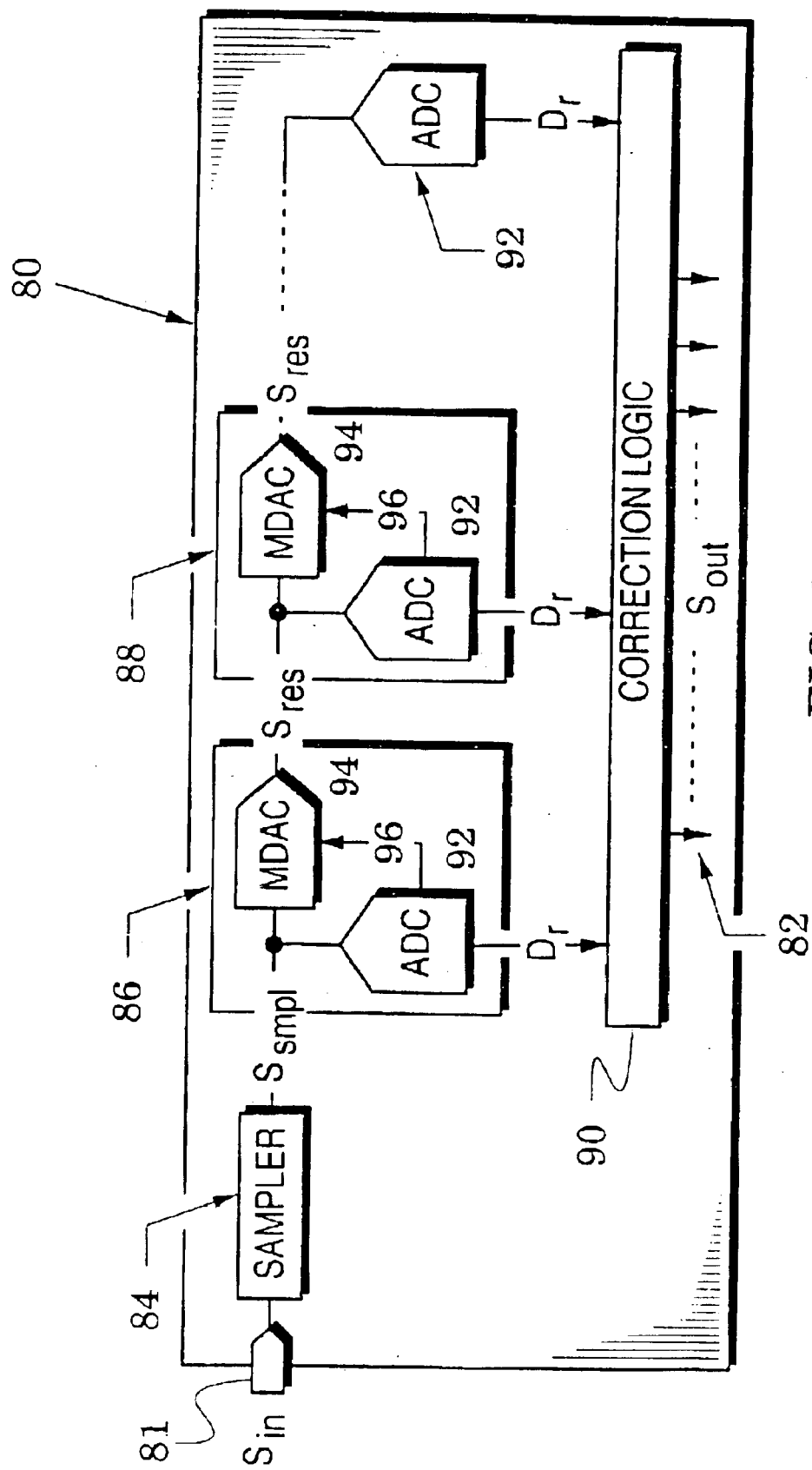
FIG. 3 is a block diagram of a pipelined ADC that can be realized with the switched-capacitor embodiments of FIGS. 2A and 2B.

The switched-capacitor structures of the present invention can advantageously be used as samplers and MDACs in a variety of signal conditioning modules such as the pipelined ADC 80 of FIG. 3. The ADC 80 includes a sampler 84, an initial converter stage 86 and at least one successive stage 88 and converts an analog input signal $S_{in}$ at an input port 81 to a corresponding digital output signal $S_{out}$ at an output port 82.

In particular, the sampler 84 provides a sample signal $S_{smpl}$ in response to the input signal $S_{in}$ and the initial converter stage 86 processes the sample signal $S_{smpl}$ to provide a residue signal $S_{res}$ and also provide respective digital bits $D_r$. In a similar fashion, each successive converter stage 88 processes a preceding residue signal $S_{res}$ to provide a successive residue signal $S_{res}$ and also provide respective digital bits $D_r$. However, the final one of the successive converter stage only provides respective digital bits $D_r$. The converter stages of the pipelined ADC 80 generally provide extra digital bits so that the pipelined ADC can include a correction logic 90 which corrects processing errors and generates the digital output signal $S_{out}$.

The initial converter stage 86 has an ADC 92 (e.g., a flash ADC) that converts the sample signal $S_{smpl}$ to respective digital bits $D_r$. The initial converter stage also has an MDAC 94 that receives the sample signal $S_{smpl}$ and also receives a decision signal 96 from the ADC 92. The decision signal indicates which of the respective digital bits $D_r$ is being provided at any given moment by the ADC 92. Although each of the successive converter stages 88 processes a preceding residue signal $S_{res}$ (rather than the sample signal $S_{smpl}$), they are configured similarly to the initial converter stage 86. In contrast, the final converter stage only includes the ADC 92.

Because the switched-capacitor structures of the invention increase isolation between structural elements and ensure that selected elements are securely turned off in one mode and quickly turned on in another mode, they reduce distortion and noise in their processed signals.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A switched-capacitor stage that operates in a sample mode and a transfer mode, the stage comprising:

first and second sample switches;

a buffer transistor having a control terminal coupled to said first sample switch and also having a current terminal;

a sample capacitor coupled between said current terminal and second sample switch to thereby receive a sample charge $Q_s$ when said first and second sample switches are closed in said sample mode; and first and second transfer switches that are respectively coupled to said control and said current terminals to bias off said buffer transistor and transfer at least a portion of said sample charge $Q_s$ to said transfer capacitor when said first and second transfer switches are closed in said transfer mode.

2. The stage of claim 1, wherein said first and second sample switches and said first and second transfer switches are metal-oxide semiconductor transistors.

3. The stage of claim 1, wherein said control terminal is a base and said current terminal is an emitter.

4. The stage of claim 1, further including:

a differential amplifier coupled to said sample capacitor and said second transfer switch; and a transfer capacitor coupled about said differential amplifier.

5. A pipelined analog-to-digital converter that converts an analog signal to a corresponding digital signal, comprising:

a sampler that provides a sample signal in response to said analog signal;

an initial converter stage that processes said sample signal to provide a residue signal and respective bits of said digitalsignal; and at least one successive converter stage that processes a preceding residue signal to provide a successive residue signal and respective bits of said digital signal wherein a final converter stage only provides said respective bits;

and wherein said sampler operates in a sample mode and a transfer mode and includes:

a) first and second sample switches;

b) a buffer transistor having a control terminal coupled to said first sample switch and also having a current terminal;

c) a sample capacitor coupled between said current terminal and second sample switch to thereby receive a sample charge Qs when said first and second sample switches are closed in said sample mode; and d) first and second transfer switches that are respectively coupled to said control and said current terminals to bias off said buffer transistor and transfer at least a portion of said sample charge $Q_s$ to said transfer capacitor when said first and second transfer switches are closed in said transfer mode.

6. The converter of claim 5, wherein said first and second sample switches and said first and second transfer switches are metal-oxide semiconductor transistors.

7. The converter of claim 5, wherein said control terminal is a base and said current terminal is an emitter.

8. The converter of claim 5, further including:

a differential amplifier coupled to said sample capacitor and said second transfer switch; and a transfer capacitor coupled about said differential amplifier.

* * * * *